United States Patent
Reddy et al.

(10) Patent No.: US 6,963,111 B2
(45) Date of Patent: Nov. 8, 2005

(54) EFFICIENT PMOS ESD PROTECTION CIRCUIT

(75) Inventors: Vijay K. Reddy, Plano, TX (US); Gianluca Boselli, Richardson, TX (US); Ekanayake A. Amerasekera, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/460,974

(22) Filed: Jun. 13, 2003

(65) Prior Publication Data

US 2004/0251502 A1    Dec. 16, 2004

(51) Int. Cl.$^7$ .................................... H01L 23/62
(52) U.S. Cl. ............... 257/356; 257/357; 257/358; 257/359; 257/360; 257/361; 257/362; 257/363; 257/364; 257/365
(58) Field of Search ............... 257/355, 356, 257/357, 354, 353, 358, 365, 360, 366, 359, 257/361, 362, 364, 367, 363, 370, 371

(56) References Cited

U.S. PATENT DOCUMENTS

| | | | |
|---|---|---|---|
| 4,821,096 A * | 4/1989 | Maloney | 327/427 |
| 6,455,897 B1 * | 9/2002 | Okawa et al. | 257/355 |
| 6,529,035 B2 * | 3/2003 | Schroeder et al. | 326/26 |
| 2003/0048588 A1 * | 3/2003 | Duvvury et al. | 361/56 |
| 2003/0076645 A1 * | 4/2003 | Ker et al. | 361/111 |

* cited by examiner

Primary Examiner—Nathan J. Flynn
Assistant Examiner—Fazli Erdem
(74) Attorney, Agent, or Firm—W. James Brady, III; Frederick J. Telecky, Jr.

(57) ABSTRACT

A pMOS transistor (601) is located in an n-well (602) and has at least one gate (603). Transistor (601) is connected between power pad Vdd or I/O pad (604) and ground potential Vss (605). Gate (603) is connected to power pad (604). The n-well (602) is capacitively (620) coupled to ground (605), decoupled from the transistor source (606) and floating under normal operating conditions. Under an ESD event, the diode formed by the source (606) and the n-well (602) is forward biased (n-well negatively biased) to turn on the lateral pnp transistor to discharge the ESD current. The well voltage keeps increasing up to the value that triggers the lateral bipolar pnp transistor. The ESD protection is scalable with the width of gate (603), improving with shrinking gate width.

2 Claims, 4 Drawing Sheets

EFFICIENT PMOS ESD PROTECTION CIRCUIT

FIELD OF THE INVENTION

The present invention is related in general to the field of electronic systems and semiconductor devices and more specifically to the field of electrostatic discharge (ESD) protection of a power and signal pad in deep submicron CMOS technologies.

DESCRIPTION OF THE RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the Machine Model", MM); it can generate transients with significantly higher rise times and current levels than the HBM ESD source. A third source is described by the "Charged Device Model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

It is well known that for non-silicided or silicide-blocked nMOS transistors, the second breakdown trigger current (It2), which is widely used as an ESD strength monitor, can be increased with larger drain contact spacings because of more uniform triggering of the lateral npn structure, due to ballast resistance effects. In addition, it is also well established that effectiveness is much reduced in the case of devices with silicided diffusions, since the ballast resistance is insufficient, making the devices susceptible to current localization, which leads to early ESD failure. In silicided cMOS devices, the primary cause of the degradation of ESD failure threshold is known to be non-uniform bipolar conduction, which is attributed to insufficient ballasting resistance in the fully silicided source/drain structures. This decrease in ESD strength imposes severe restrictions on the efficient design of ESD protection. Known options for correcting this shortcoming, based on nMOS transistors, do not scale well with protection devices width. Furthermore, multi-finger protection circuits employing snap-back devices are typically limited by inadequate finger turn-on. Based on nMOS transistors, It2 is sufficient only if strong substrate pumping is available, which excludes p+ substrates.

An urgent need has therefore arisen for cost effective design methods to achieve advanced ESD protection, compatible with uniform turn-on, high response speed, low capacitance and low leakage current using standard CMOS processing. The device structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

One embodiment of the invention is a pMOS transistor with at least one gate, located in an n-well, providing protection against ESD damage of an integrated circuit power pad or signal I/O pad. This transistor is connected between the power pad or signal I/O pad, and Vss ground potential. The gate and source are connected to the power pad or signal I/O pad, and the n-well is connected to the power pad. In this fashion, the device operates as a lateral pnp transistor for ESD stress to ground potential, and the ESD protection is scalable with the width of the gate.

As the technology down-scaling continues, the beta of the parasitic bipolar pnp keeps increasing, resulting in more efficient snapback action. Along with the n-well confined behavior, the technology scaling will cause pMOS transistors to be increasingly efficient in snapback conduction mode.

In another embodiment of the invention, a device, which provides protection against ESD damage of an integrated circuit power pad or signal I/O pad, consists of a pMOS transistor, with at least one gate, located in an n-well. The transistor is connected between the power pad, or signal I/O pad, and Vss ground potential. The gate and source are connected to the power pad, or signal I/O pad, and the n-well is capacitively coupled to ground and decoupled from the transistor source. Under ESD stress, the diode formed by the source and the n-well is negatively biased and the ESD current discharges through the capacitor.

In another embodiment of the invention, a circuit, which provides protection against ESD damage of an integrated circuit power pad or signal I/O pad, consists of two or more transistors stacked in series, wherein each of the transistors is located in a separate n-well. Each transistor has at least one gate, and together they provide a cascode for higher voltage handling capability. The transistors are connected between the power pad, or signal I/O pad, and Vss ground potential, whereby the transistor, which is directly connected to the power pad or signal I/O pad, has its at least one gate and source and its n-well connected to the power pad or signal I/O pad. In this manner, the circuit operates as a lateral pnp transistor for ESD stress to ground potential, and the ESD protection is scalable with the width of the gate.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 1A shows a pMOS transistor in an n-well between a power pad, or I/O signal pad, and ground potential.

FIG. 1B shows pMOS ESD clamps as protection between multiple power supply planes, with the additional option of a resistor coupled between transistor gate and power pad.

DETAILED DESCRIPTION OF THE PREFERRED EMBODIMENTS

The present invention is related to U.S. patent Ser. No. 10/213,386, filed Aug. 6, 2002 (Charvaka et al., "Output Buffer and I/O Protection Circuit for CMOS Technology").

Figure 1A:
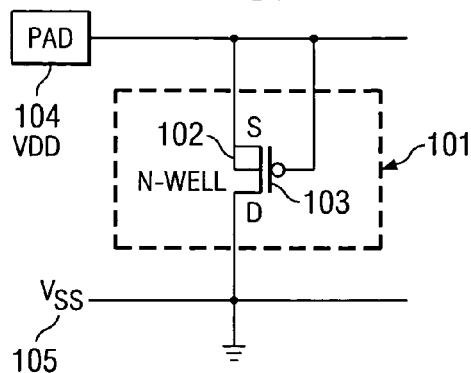
FIGS. 1A and 1B are schematic diagrams, which illustrate two related embodiments of the invention.

FIG. 1A is a schematic circuit diagram of the connectivity of an embodiment of the invention, a device providing protection against ESD damage of an integrated circuit (IC) power pad, or signal I/O pad for positive ESD event. A pMOS transistor 101 is located in an n-well 102 and has at least one gate 103. Transistor 101 is connected between power pad Vdd 104 and ground potential Vss 105. Gate 103 is connected to power pad 104. The n-well 102 is also connected to power pad 104. With this connectivity, the device depicted in FIG. 1 is operable as a lateral pnp transistor for ESD stress to ground potential. It is a technical advantage of selecting a pMOS transistor for this connectivity that the ESD protection is scalable with the width of gate 103; the protection capability of the device does not diminish with smaller gate width, but rather improves. It should be mentioned that instead of a power pad, pad 104 may be an I/O pad.

Figure 1B:
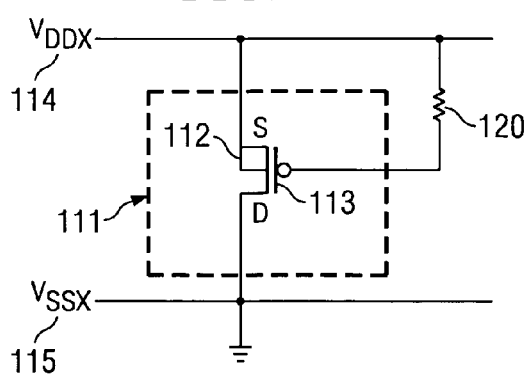

FIG. 1B indicates that the embodiment of FIG. 1A can be generalized as an approach for implementing a pMOS ESD clamp for protection between multiple power supply planes. In this embodiment, the power supply voltage 114 is indicated as Vddx, and the ground potential 115 as Vssx. Numerous connections of the pMOS transistor 111, located in an n-well 112, can thus be protected, for example:

Vdd1 to Vdd2,
Vdd1 to Vss1,
Vss2 to Vss1,
Vdd2 to Vss1, and many more.

Furthermore, a resistor 120 may be coupled between transistor gate 113 and power pad 114 to help improve the RC timing.

Figure 2:
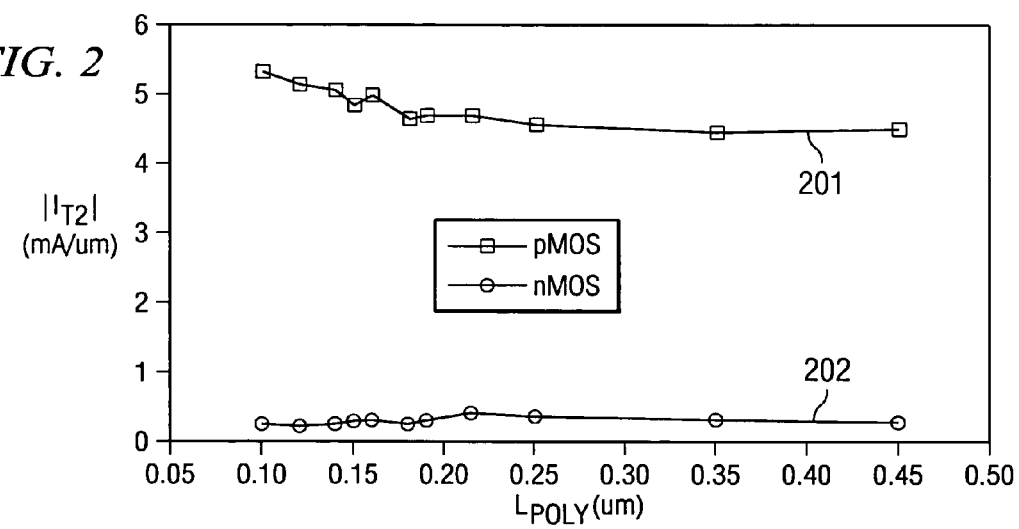
FIG. 2 is a plot of the second breakdown trigger current It2 (in mA/$\mu$m) as a function of the gate length (in $\mu$m) for nMOS and pMOS transistors.

In order to appreciate the pMOS transistor capability more clearly, the second breakdown trigger current IT2 performance (measured in mA/$\mu$m) of nMOS and pMOS transistors is compared (fully salicided technology). For this comparison, p– thin epitaxial silicon is built on p+ substrate; the gate length is at least 0.1 $\mu$m, and the single finger modules have a width of 20 $\mu$m. All devices have a "one-square" substrate resistance for the comparison (the substrate tap is placed at a distance from the drain/source equal to the transistor width). In FIG. 2, It2 is plotted as a function of the gate length Lpoly (in $\mu$m). As curve 201 shows, the pMOS transistors offer a fairly good It2. It is interesting to note in curve 201 that the pMOS It2 increases with shorter gate length, likely due to the increased lateral pnp gain. On the other hand, curve 202 shows that the nMOS It2 performance is nearly zero for all gate lengths measured, a consequence of insufficient substrate resistance with the p+ substrate. With such low substrate resistance, the substrate current required to forward-bias the emitter/base junction is so high that the drain/substrate junction is deeply reverse biased. This causes either thermal damage at the junction or breakdown of the thin oxide, whichever occurs first.

Figure 3:
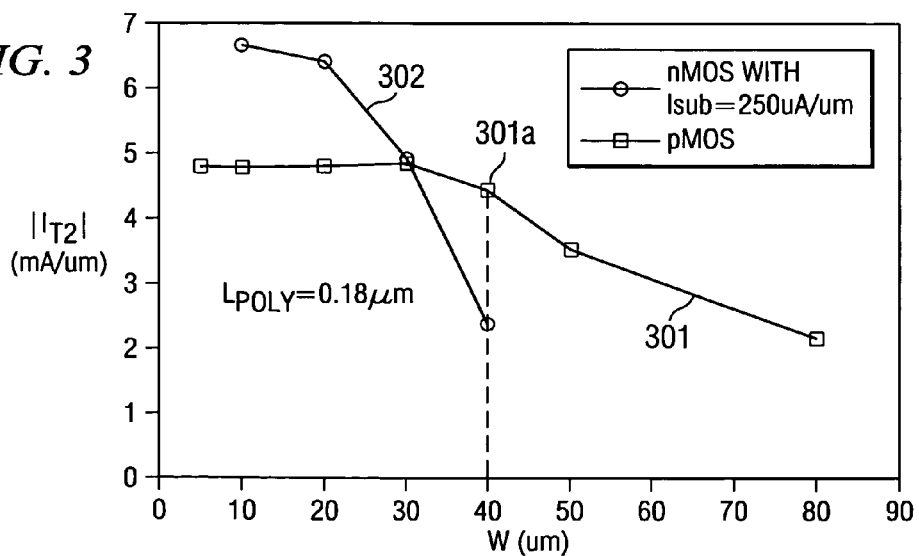
FIG. 3 is a plot of the second breakdown trigger current It2 (in mA/$\mu$m) as a function of the gate width W (in $\mu$m) for nMOS and pMOS transistors.

The most appealing feature of pMOS transistors in snapback condition mode is their scaling behavior with gate width. In FIG. 3, the It2 performance (in mA/$\mu$m) for the nMOS and pMOS transistors is plotted as a function of the gate width W (in $\mu$m) (for the nMOS transistor, substrate current Isub is held at 250 $\mu$A/$\mu$m; for the pMOS transistor, gate length L is 0.18 $\mu$m). As can be seen, even with a considerable injected substrate current Isub, the nMOS transistor (curve 302) shows a strong It2 roll-off. In contrast, the pMOS transistor (curve 301) holds a constant It2 up to some gate width W (approximately point 301a), and a gradual roll-off for larger gate width values. This feature allows much easier design of multi-finger structures, where the main concern is achieving uniform conduction. Based on the data of FIG. 3, transistor finger widths of 50 $\mu$m and higher are feasible.

Figure 4:
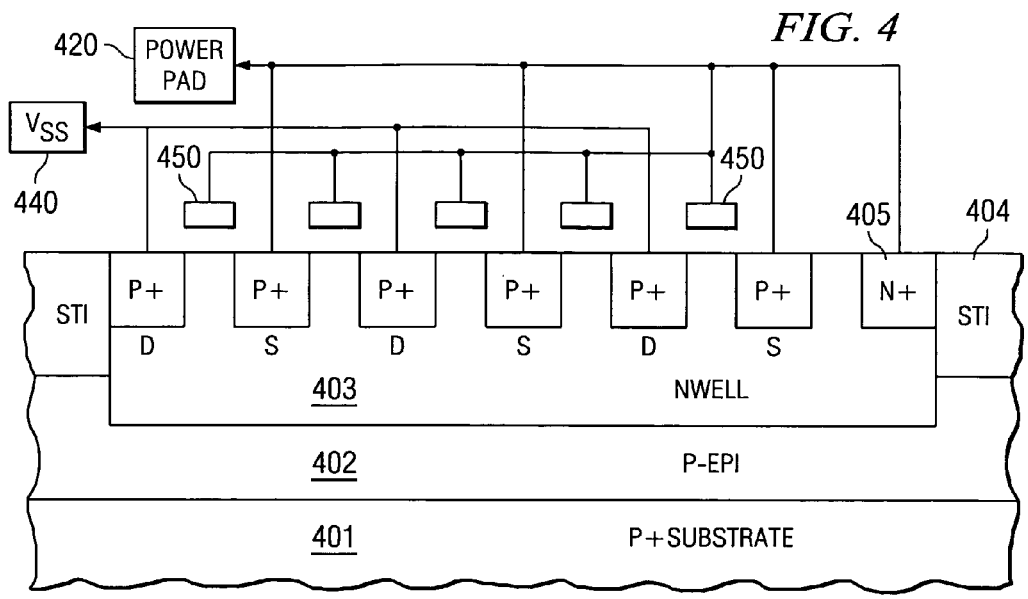
FIG. 4 is a cross-sectional diagram of a multi-finger pMOS transistor of an embodiment of the invention.

An example of an embodiment of such multi-finger pMOS transistor, providing protection against ESD damage of a power pad 420, is given in the schematic cross section of FIG. 4. A p+-type semiconductor substrate 401 has a less p-doped epitaxial layer 402. In this p-epitaxial layer 402, an n-well 403 is formed, confined on the sides by shallow trench isolations 404. The n-well has a contact region 405, which is connected to the power pad 420. A multi-finger pMOS transistor is formed in n-well 403 so that it has a plurality of gates 450. The pMOS transistor is connected between the power pad 420 and the Vss ground terminal 440. As FIG. 4 shows, this connection is accomplished by alternatively connecting the p+ regions of the transistor to power pad 420 and Vss terminal 440. Due to the connectivity of the pMOS transistor, the device is operable as a lateral pnp transistor for ESD stress to ground potential.

Figure 5:
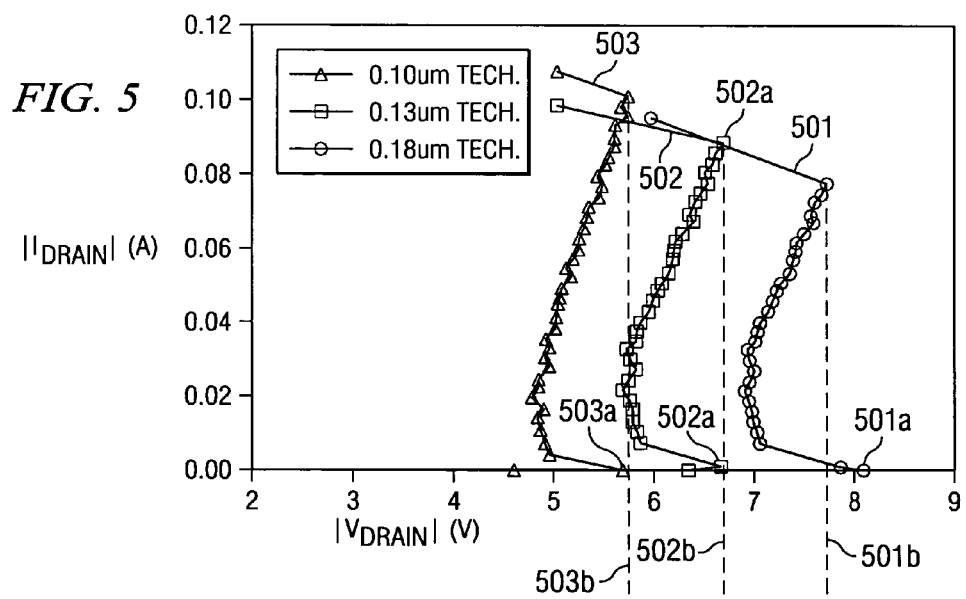
FIG. 5 is a plot of the drain current Idrain (in A) as a function of the drain voltage Vdrain (in V) for pMOS transistors of three successive technology nodes.

The advantage of pMOS ESD protection transistors in view of the semiconductor industry's scaling trends is depicted in FIG. 5. Current/voltage plots of pulsed pMOS transistors are displayed for three successive technology nodes, expressed as gate length feature size (in $\mu$m). The successive I/V curves are designated 501, 502, and 503. As technology scales downward, every technology results in roughly a one-volt reduction of the snapback voltage, voltage values 501a, 502a, and 503a, with respect to the previous node. Similar one-volt reductions affect the voltage correlated with It2, voltage values 501b, 502b, and 503b, with respect to the previous node. In related fashion, as the technology down-scaling continues, the beta of the parasitic bipolar pnp keeps increasing, resulting in deeper snapback action. The technical advantage of efficient parasitic bipolar snapback characteristics of pMOS devices is particularly evident in sub-0.13 $\mu$m CMOS technologies.

Figure 6:
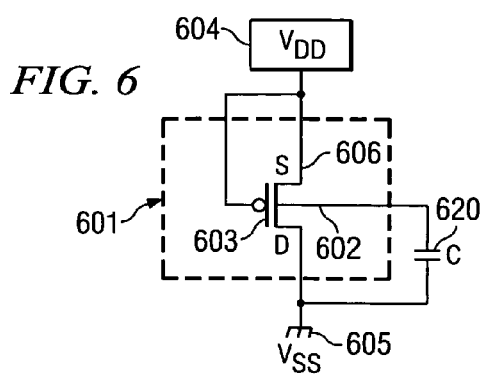
FIG. 6 is a schematic diagram illustrating another embodiment of the invention.

Another embodiment of the invention is displayed in the schematic circuit diagram of FIG. 6. A pMOS transistor 601 is located in an n-well 602 and has at least one gate 603. Transistor 601 is connected between power pad Vdd 604 and ground potential Vss 605. It should be mentioned that instead of a power pad, pad 604 can be an I/O pad. Gate 603 is connected to power pad 604. The n-well 602 is capacitively (620) coupled to ground 605; because of capacitor 620, the n-well 602 is decoupled from the transistor source 606 and is floating under normal operating conditions. This embodiment represents an anti-leakage approach. With this connectivity, the device depicted in FIG. 6 is operable under an ESD event as follows. The diode formed by the source 606 and the n-well 602 is forward biased (n-well negatively biased) to turn on the lateral pnp transistor to discharge the ESD current. The well voltage keeps increasing up to the value that triggers the lateral bipolar pnp transistor. It is a technical advantage of selecting a pMOS transistor for this connectivity that the ESD protection is scalable with the width of gate 603; the protection capability of the device does not diminish with smaller gate width, but rather improves.

Figure 7:
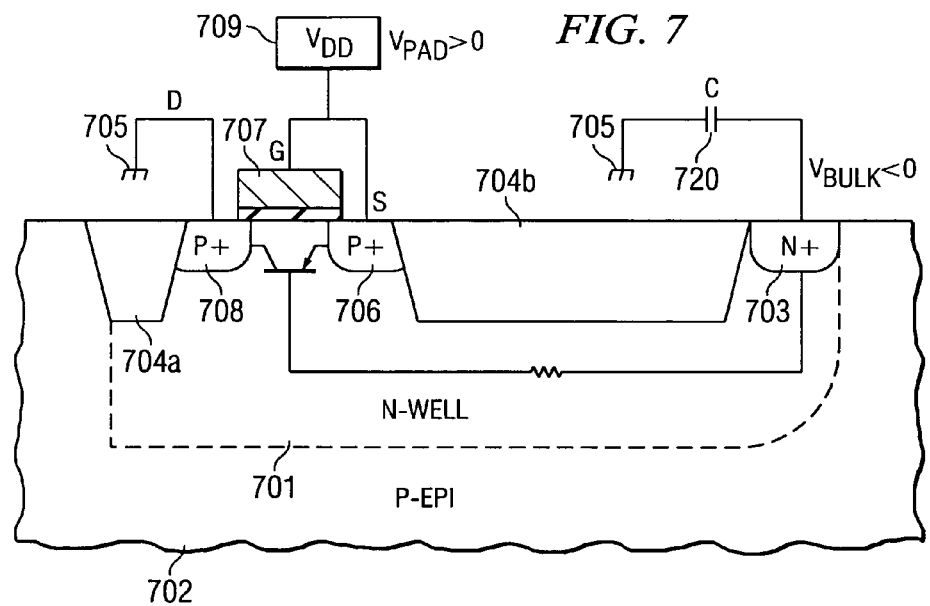
FIG. 7 is a simplified cross sectional diagram of the embodiment shown in FIG. 5.

A simplified cross sectional diagram of the embodiment of FIG. 6 is depicted in FIG. 7. An n-well 701 is formed in p- epitaxial semiconductor material 702; the well has an n+ contact region 703, which is connected through capacitor 720 to ground 705. Confined between shallow trench isolations 704a and 704b is a pMOS transistor (only one finger shown in FIG. 7) consisting of source 706, gate 707, and drain 708. Source 706 and gate 707 are connected to power pad 709 (Vdd), and drain 708 is connected to ground 705. Instead of a Vdd power pad, pad 709 can also be an I/O pad.

Figure 8:
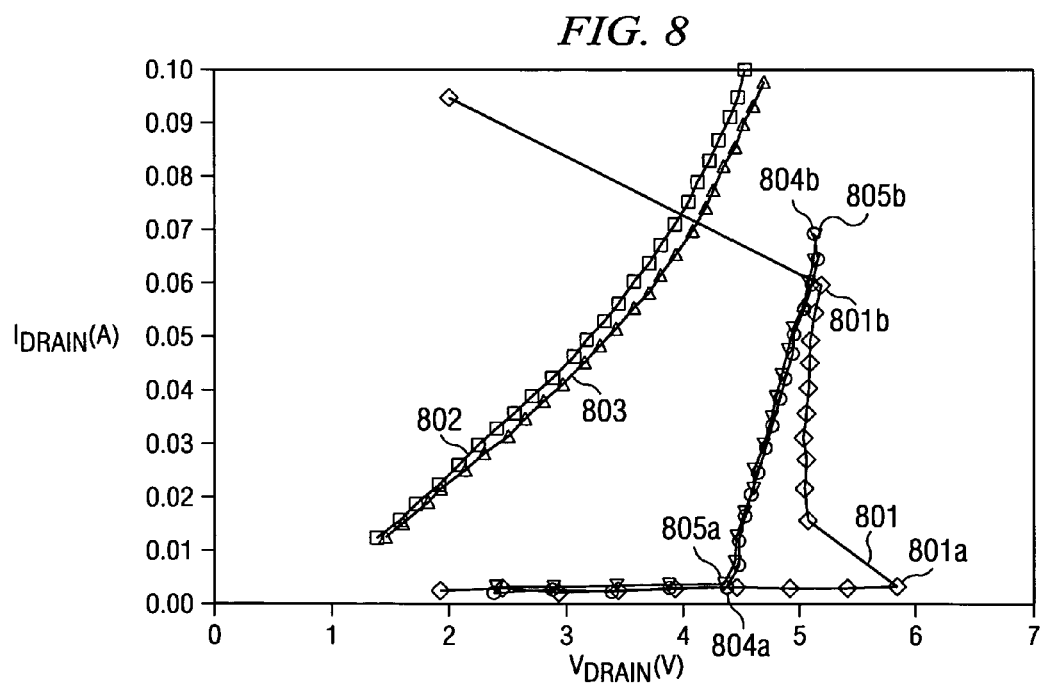
FIG. 8 is a plot of the drain current Idrain (in A) as a function of the drain voltage Vdrain (in V) for pMOS transistors as ESD clamps in various substrate coupling configurations.

In FIG. 8, the drain current Idrain (in A) is plotted as a function of the drain voltage Vdrain (in V) for pMOS transistors as ESD clamps in various substrate coupling configurations. For all devices investigated, the gate width is 10$\mu$. In curve 801, the standard configuration, the substrate is connected to the power pad, or I/O pad. In this configuration, I/V curve 801 exhibits the conventional characteristics including the snapback voltage point 801a and the second breakdown trigger current It2 at point 801b. In curves 802 and 803, the substrate is grounded. The I/V curves exhibit the behavior of a diode. In curves 804 and 805, the substrate is floating as illustrated in FIGS. 6 and 7.

The I/V curves exhibit a lower snapback voltage at point 804a, 805a, compared to the original point 801a, but a higher (improved) It2 point 804b, 805b. Curves 804, 805 show further no dependence on swapping source and drain.

Figure 9:
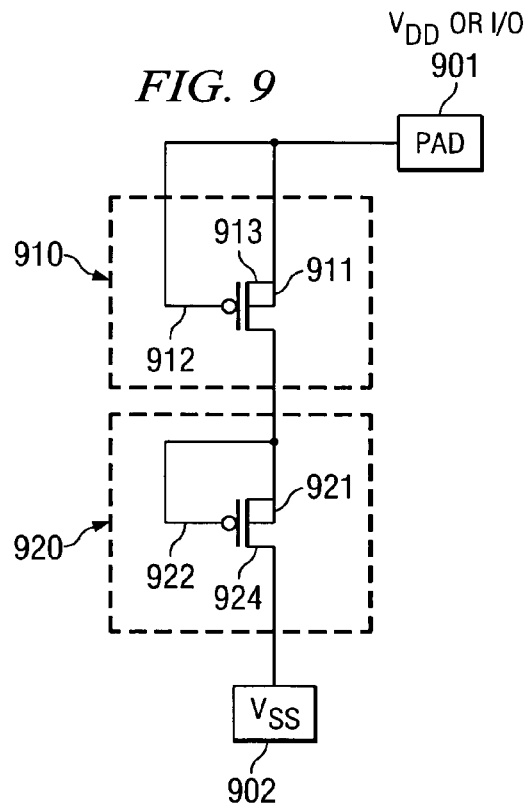
FIG. 9 is a schematic diagram illustrating another embodiment of the invention.

Another embodiment of the invention is displayed in the schematic circuit diagram of FIG. 9. In this embodiment, a pMOS supply clamp (power clamp) for ESD protection is implemented in a high voltage application. The embodiment is based on a cascade of pMOS transistors (two or more pMOS transistors), wherein each transistor is located in a separate n-well, and the cascode provides for higher voltage handling capability. In FIG. 9, two pMOS transistors 910 and 920 are stacked in series. Transistor 910 is located in n-well 911, transistor 920 is located in n-well 921. Each transistor has at least one gate, transistor 910 has gate 912, transistor 920 has gate 922. Both transistors are connected between power pad, or signal pad, 901 and Vss ground potential 902. Transistor 910 has its at least one gate 912 and its n-well 911 (and source 913) connected to power pad, or signal pad, 901. Transistor 920 has its drain 924 connected to Vss ground potential. With this connectivity, the circuit depicted in FIG. 9 is operable as a lateral pnp transistor for ESD stress to ground potential. It is a technical advantage for selecting pMOS transistors for this connectivity that the ESD protection is scalable with the width of gates 912 and 922. The protection capability of the circuit does not diminish with small gate width, but rather improves.

Figure 10:
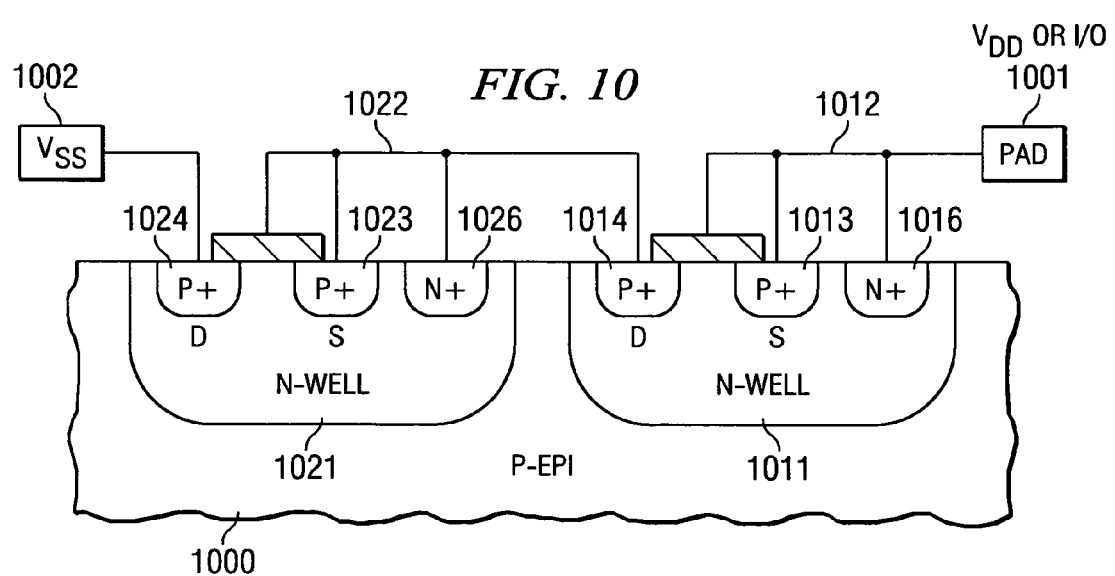
FIG. 10 is a simplified cross sectional diagram of the embodiment shown in FIG. 9.

FIG. 10 is a simplified cross sectional diagram of the embodiment shown in FIG. 9. n-wells 1011 and 1021 are formed in p- epitaxial semiconductor material 1000; the wells have n+ contact regions 1016 and 1026, respectively. N-well contact 1016 which is connected to Vdd power pad, or I/O pad, 1001. In each n-well is a pMOS transistor; only one finger of each gate 1012 and 1022 is shown. The transistor in n-well 1011 consists of source 1013, gate 1012, and drain 1014; The transistor in n-well 1021 consists of source 1023, gate 1022, and drain 1024. Source 1013 and gate 1012 (and n-well contact 1016) are connected to power pad 1001 (Vdd), and drain 1024 is connected to ground 1002. Instead of a Vdd power pad, pad 1001 can also be an I/O pad.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in IC manufacturing. It is therefore intended that the appended claims encompass any such modifications or embodiments.

We claim:

1. A device providing protection against ESD damage of an integrated circuit power pad, or signal I/O pad, comprising:

a pMOS transistor located in an n-well, said transistor having at least one gate;

said transistor connected between said power pad, or signal I/O pad, and Vss ground potential;

said at least one gate connected to said power pad, or signal I/O pad; and said n-well capacitively coupled to ground and decoupled from the transistor source;

whereby, under ESD stress, the diode formed by said source and said n-well is negatively biased and the ESD current discharges through said capacitor.

2. A circuit, improved for ESD protection of an integrated circuit power pad or signal I/O pad, comprising:
  two or more pMOS transistors stacked in series, each of said transistors located in a separate n-well, said transistors having at least one gate, providing a cascade for higher voltage handling capability;
  said transistors connected between said power pad, or signal I/O pad, and Vss ground potential; and
  said transistor directly connected to said power pad, or signal I/O pad, having its at least one gate and its n-well connected to said power pad, or signal I/O pad;
  whereby said circuit is operable as a lateral pnp transistor for ESD stress to ground potential, said ESD protection scalable with the width of said gate.

* * * * *